United States Patent
Iwasaki et al.

(10) Patent No.: US 9,219,222 B2
(45) Date of Patent: Dec. 22, 2015

(54) VIBRATION DEVICE AND PORTABLE TERMINAL EMPLOYING THE SAME

(75) Inventors: Satoru Iwasaki, Kyoto (JP); Tooru Takahashi, Kyoto (JP); Yasuhito Fujii, Kyoto (JP); Harumi Hayashi, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 0 days.

(21) Appl. No.: 13/993,440

(22) PCT Filed: Jul. 31, 2012

(86) PCT No.: PCT/JP2012/069416
§ 371 (c)(1),
(2), (4) Date: Jun. 12, 2013

(87) PCT Pub. No.: WO2013/145357
PCT Pub. Date: Oct. 3, 2013

(65) Prior Publication Data
US 2015/0028721 A1    Jan. 29, 2015

(30) Foreign Application Priority Data

Mar. 30, 2012  (JP) ................................ 2012-080741
May 12, 2012   (JP) ................................ 2012-110131

(51) Int. Cl.
*H01L 41/053*    (2006.01)
*H01L 41/09*     (2006.01)
(Continued)

(52) U.S. Cl.
CPC .......... *H01L 41/0926* (2013.01); *H01L 41/053* (2013.01); *H04R 7/045* (2013.01); *H04R 17/00* (2013.01); *H04R 2499/11* (2013.01)

(58) Field of Classification Search
CPC ...................... H01L 41/053; H01L 41/0926
USPC ......................................................... 310/348
See application file for complete search history.

(56) References Cited

U.S. PATENT DOCUMENTS 7,554,248 B2 *  6/2009  Oda et al. ...................... 310/348
9,031,265 B2 *  5/2015  Fukushima et al. .......... 381/190
(Continued)

FOREIGN PATENT DOCUMENTS

JP        55107796 U      7/1980
JP       2002330496 A    11/2002
(Continued)

OTHER PUBLICATIONS

Korean Office Action with English concise explanation, Korean Patent Appln. No. 10-2013-7010414, May 19, 2014, 4 pp.
(Continued)

*Primary Examiner* — J. San Martin
(74) *Attorney, Agent, or Firm* — Volpe and Koenig, P.C.

(57) ABSTRACT

A low-profile vibration device capable of generation of great vibration and a portable terminal employing the vibration device. The vibration device includes: a support body; a vibration member supported so that its periphery is connected to the support body, the vibration member having a first portion which is connected to the support body, and a second portion which is located inside the first portion and is not connected to the support body; and a vibration element whose one surface in a first direction is connected to one main surface of the second portion in the vibration member, bending vibration of the vibration element in the first direction whose amplitudes vary along a second direction perpendicular to the first direction being caused by electrical signal input.

4 Claims, 11 Drawing Sheets

(51) Int. Cl.
*H04R 7/04* (2006.01)
*H04R 17/00* (2006.01)

(56) References Cited

U.S. PATENT DOCUMENTS

| | | | |
|---|---|---|---|
| 2013/0241352 A1* | 9/2013 | Hayashi et al. | 310/323.01 |
| 2013/0259274 A1* | 10/2013 | Hayashi et al. | 381/190 |
| 2014/0132115 A1* | 5/2014 | Fujii et al. | 310/330 |
| 2014/0342783 A1* | 11/2014 | Suzuki et al. | 455/569.1 |

FOREIGN PATENT DOCUMENTS

| | | | |
|---|---|---|---|
| JP | 2006238072 A | | 9/2006 |
| JP | 2007082009 A | | 3/2007 |
| JP | 2011107766 A | * | 6/2011 |

OTHER PUBLICATIONS

Japanese International Search Report, PCT/JP2012/069416, Sep. 28, 2012, 2 pp.

* cited by examiner

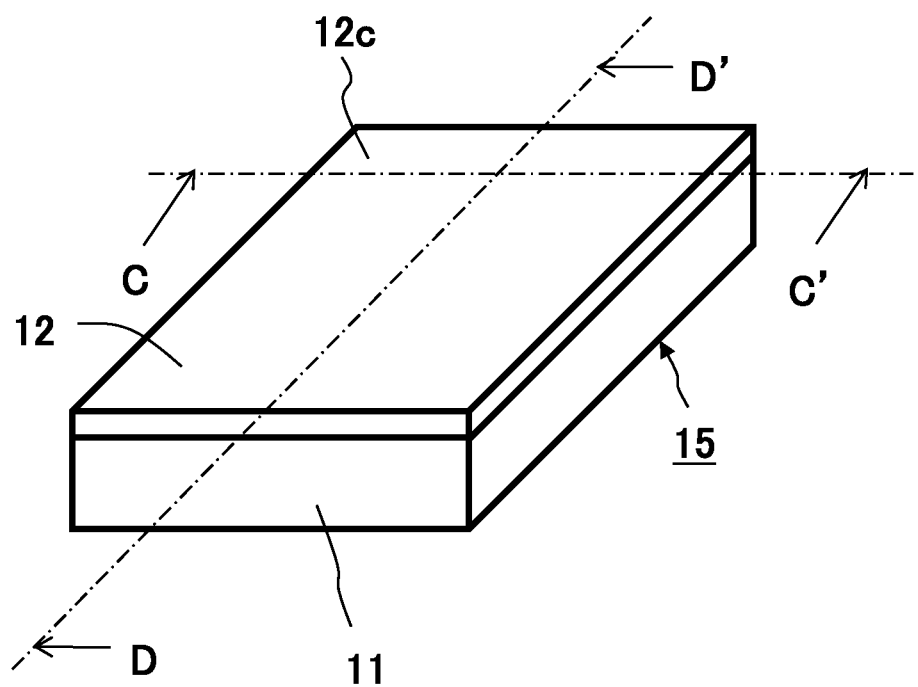
FIG. 8
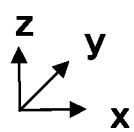

FIG. 9
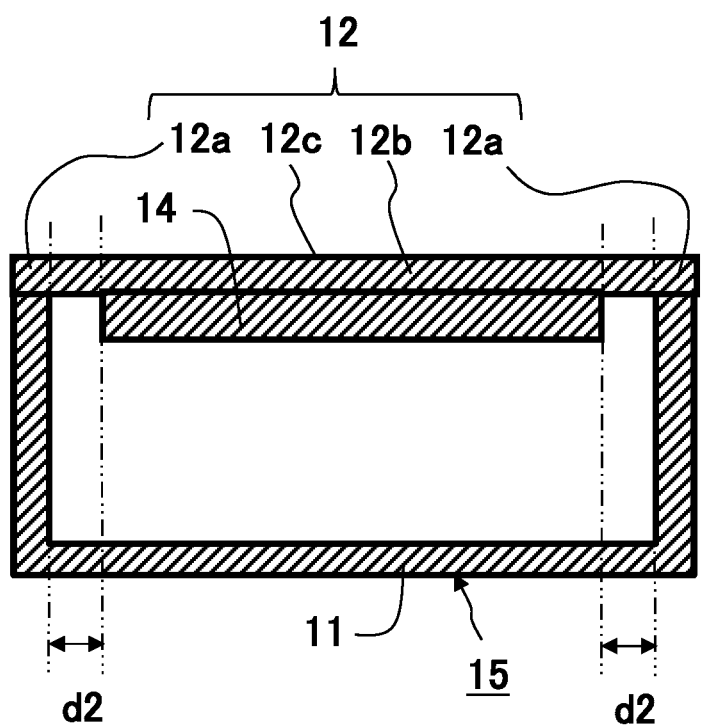
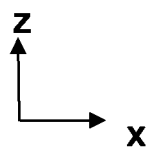

VIBRATION DEVICE AND PORTABLE TERMINAL EMPLOYING THE SAME

FIELD OF INVENTION

The present invention relates to a vibration device and a portable terminal which employs the vibration device.

BACKGROUND

There has hitherto been known a vibration device constructed by fixing a vibration element made of a plate-like piezoelectric bimorph element to a vibration plate (cabinet) and vibrating the vibration element to vibrate the vibration plate (refer to Patent literature 1, for example).

CITATION LIST

Patent Literature

Patent Literature 1: Japanese Unexamined Patent Publication JP-A 2006-238072

SUMMARY

Technical Problem

However, as a problem posed by the above-described conventional vibration device, a sufficient space needs to be secured between the vibration element and the vibration plate to prevent contact between them at the time of an impact, which results in the difficulty in device miniaturization. As another problem, through the studies conducted by the inventors, it has been found out that, in the case of connecting one main surface of the vibration element directly to one main surface of the vibration plate to make the vibration device lower in profile, depending on the position of installation of the vibration element, the vibration of the vibration plate may be diminished.

The invention has been devised in view of the problems as mentioned supra, and accordingly an object of the invention is to provide a low-profile vibration device capable of generation of great vibration, and a portable terminal which employs the vibration device.

Solution to Problem

A vibration device of the invention comprises at least: a support body; a vibration member supported so that its periphery is connected to the support body, the vibration member having a first portion which is connected to the support body, and a second portion which is located inside the first portion and is not connected to the support body; and a vibration element whose one surface in a first direction is connected to one main surface of the second portion in the vibration member, bending vibration of the vibration element in the first direction whose amplitudes vary along a second direction perpendicular to the first direction being caused by electrical signal input, a first distance which is a distance between the vibration element and the first portion in a third direction which is perpendicular to the first and second directions, being longer than a second distance which is a distance between the vibration element and the first portion in the second direction.

A portable terminal of the invention comprises at least: the vibration device mentioned above; and an electronic circuit that generates an electric signal to be inputted to the vibration element.

Advantageous Effects of Invention

According to the vibration device of the invention, a low-profile vibration device capable of generation of great vibration can be attained. According to the portable terminal of the invention, a low-profile portable terminal capable of transmitting sound information clearly can be attained.

BRIEF DESCRIPTION OF THE DRAWINGS

FIG. 8 is a perspective view schematically showing a portable terminal in accordance with a second embodiment of the invention;

FIG. 9 is a sectional view taken along the line C-C' of FIG. 8;

DETAILED DESCRIPTION OF THE PREFERRED EMBODIMENTS

Hereinafter, a vibration device and a portable terminal which employs the vibration device according to the invention will be described in detail with reference to the accompanying drawings.

First Embodiment

Figure 1:
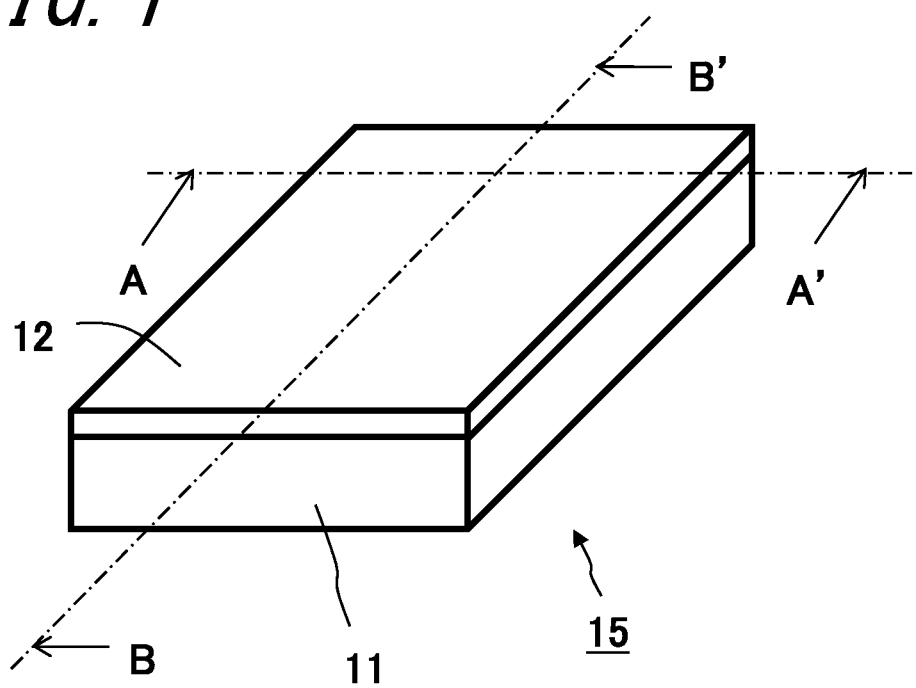
FIG. 1 is a perspective view schematically showing a vibration device in accordance with a first embodiment of the invention.
Figure 2:
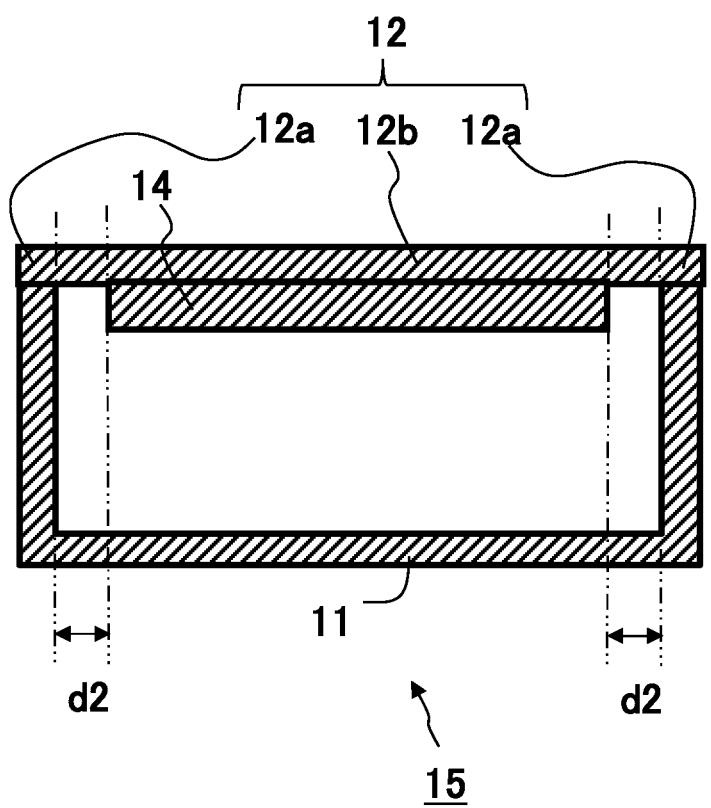
FIG. 2 is a sectional view taken along the line A-A' of FIG. 1.
Figure 3:
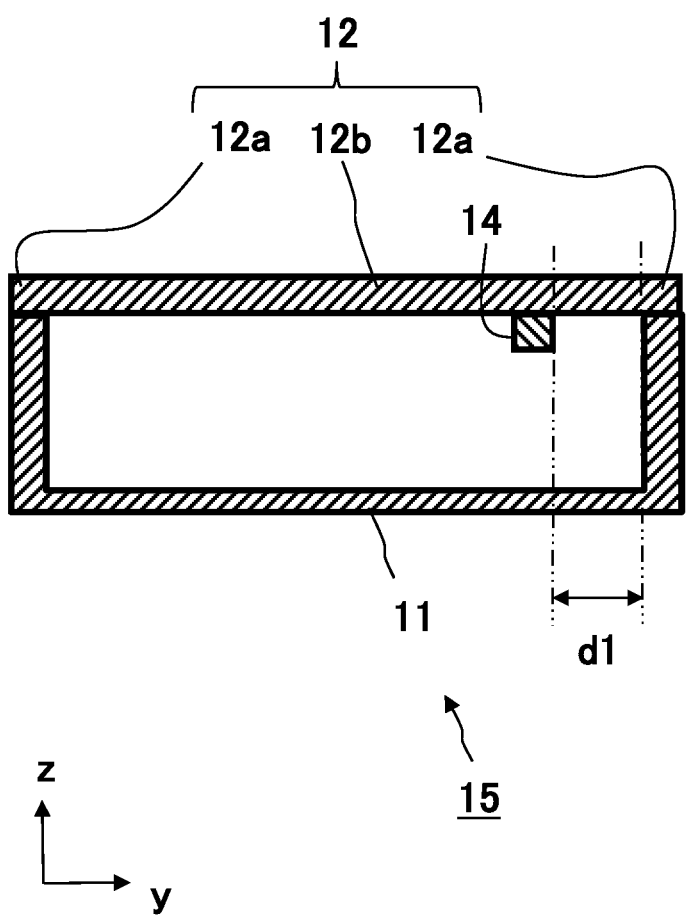
FIG. 3 is a sectional view taken along the line B-B' of FIG. 1.
Figure 4:
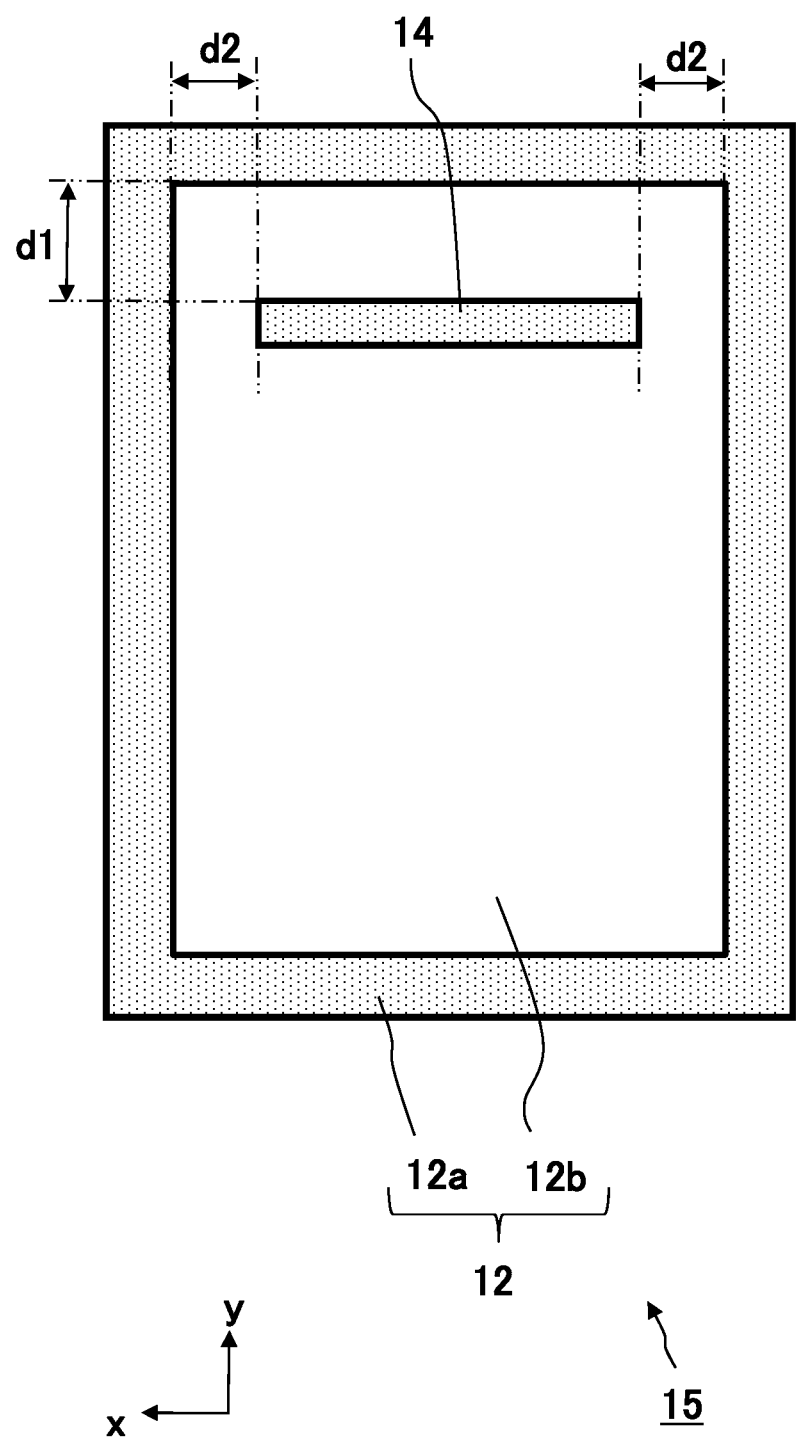
FIG. 4 is a plan view schematically showing a support body of the vibration device as shown in FIG. 1 in a see-through representation.

FIG. 1 is a perspective view schematically showing a vibration device in accordance with a first embodiment of the invention. FIG. 2 is a sectional view taken along the line A-A' of FIG. 1. FIG. 3 is a sectional view taken along the line B-B' of FIG. 1. FIG. 4 is a plan view schematically showing a support body 11 of a vibration device 15 as shown in FIG. 1 in a see-through representation. In FIG. 4, there is shown the vibration device as viewed in a-z direction. Moreover, in FIGS. 2 to 4, the diagrammatic representation of the detailed structure of a vibration element 14 is omitted for the simplicity of illustration.

The vibration device 15 of this embodiment has a rectangular parallelepiped shape, in which the direction of its thickness is defined by a first direction (a z-axis direction in the drawing), the direction of its width is defined by a second direction perpendicular to the first direction (an x-axis direction in the drawing), and the direction of its length is defined by a third direction perpendicular to the first and second directions (a y-axis direction in the drawing). Moreover, the vibration device 15 of this embodiment comprises a support body 11, a vibration plate 12, and a vibration element 14.

The support body 11 is shaped like a box with its one face opened. The support body 11 may be suitably formed of a synthetic resin or the like having great rigidity and elasticity, but other material such as a metal may also be used therefor. Moreover, the support body 11 may be given a shape other than the box-like shape, for example, a frame-like shape. Further, the support body 11 does not necessarily have to be of a one-piece component. The support body 11 may be composed of a plurality of components.

The vibration plate 12 is shaped like a thin plate, in which the direction of its thickness is defined by the first direction (the z-axis direction in the drawing), the direction of its width is defined by the second direction (the x-axis direction in the drawing), and the direction of its length is defined by the third direction (the y-axis direction in the drawing). Moreover, the vibration plate 12 is supported so that a periphery of its one main surface (main surface on −z-direction side in the drawing) is connected to the support body 11, and includes a first portion 12a which is connected to the support body 11 and a second portion 12b which is located inside the first portion 12a and is not connected to the support body 11. The vibration plate 12 can be suitably made of a material having great rigidity and elasticity such as an acrylic resin or glass. The thickness of the vibration plate 12 is adjusted to fall in a range of about 0.4 mm to 1.5 mm, for example. The connection between the support body 11 and the vibration plate 12 can be made by using, for example, already available adhesives of various types.

The vibration element 14 has a rectangular parallelepiped shape, in which the direction of its thickness is defined by the first direction (the z-axis direction in the drawing), the direction of its length is defined by the second direction (the x-axis direction in the drawing), and the direction of its width is defined by the third direction (the y-axis direction in the drawing). That is, the vibration element 14 is so disposed that the lengthwise direction of the vibration element 14 conforms to the widthwise direction of the vibration plate 12, and the widthwise direction of the vibration element 14 conforms to the lengthwise direction of the vibration plate 12. Moreover, the vibration element 14 is configured so that its one surface in the first direction (+z-direction side in the drawing) is connected to one main surface (main surface on −z-direction side in the drawing) of the second portion 12b in the vibration plate 12. Note that the vibration element 14 is connected to the second portion 12b so as to lie centrally thereof in the second direction (the x-axis direction in the drawing), as well as to lie toward one side thereof in the third direction (+y-direction side in the drawing).

Figure 5:
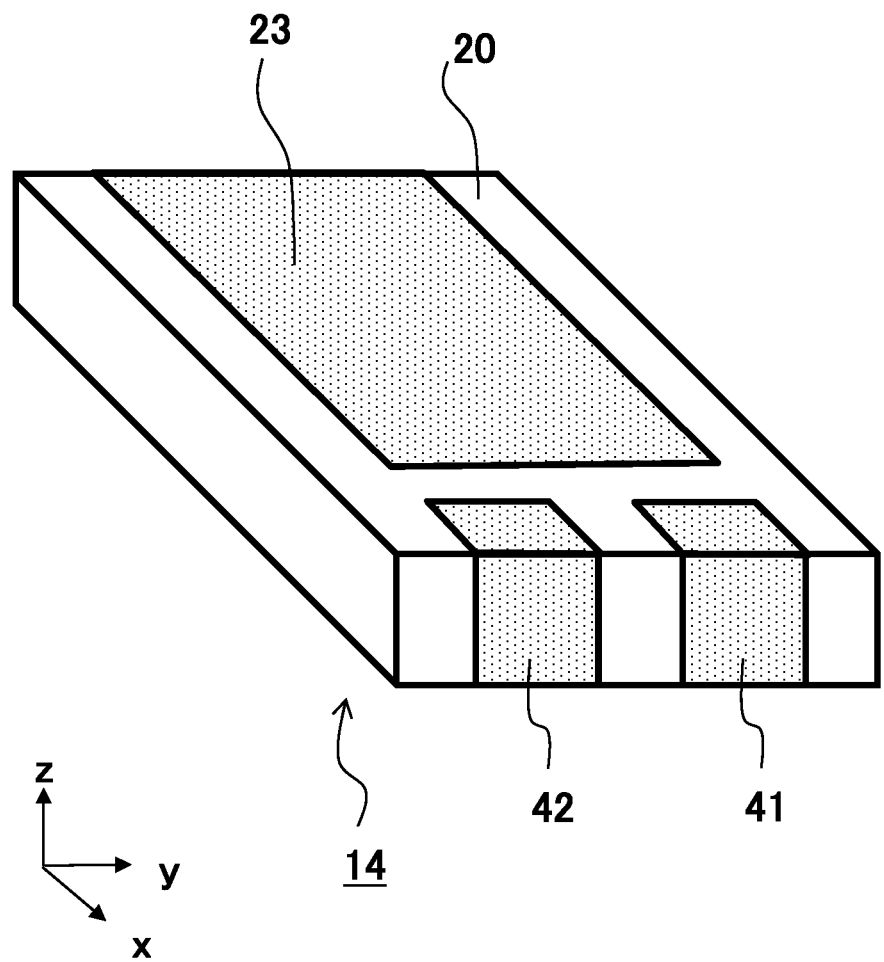
FIG. 5 is a perspective view schematically showing a vibration element shown in FIG. 1.
Figure 6:
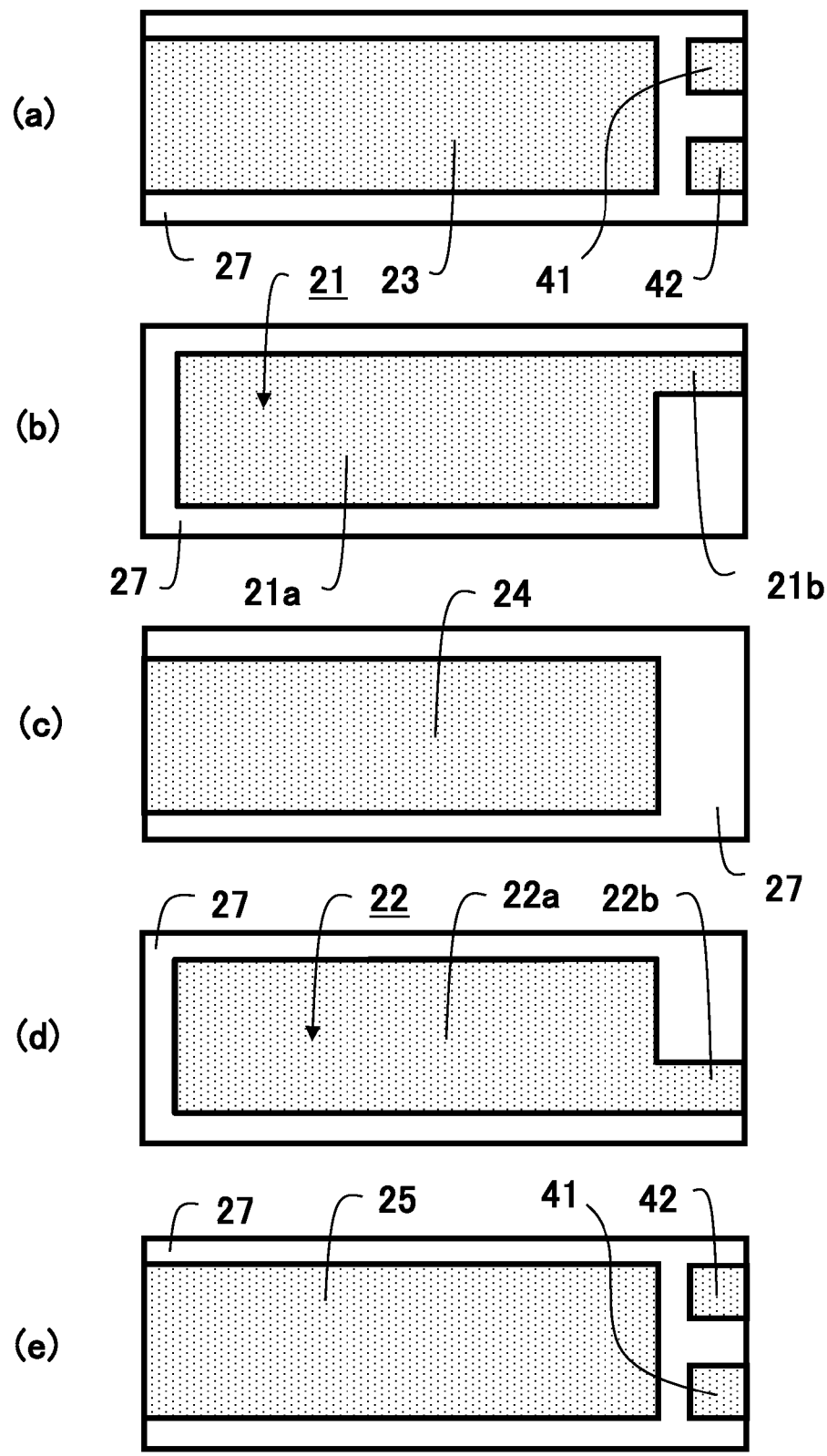
FIGS. 6(a) through 6(e) are plan views for explaining the structure of the vibration element shown in FIG. 5.
Figure 7:
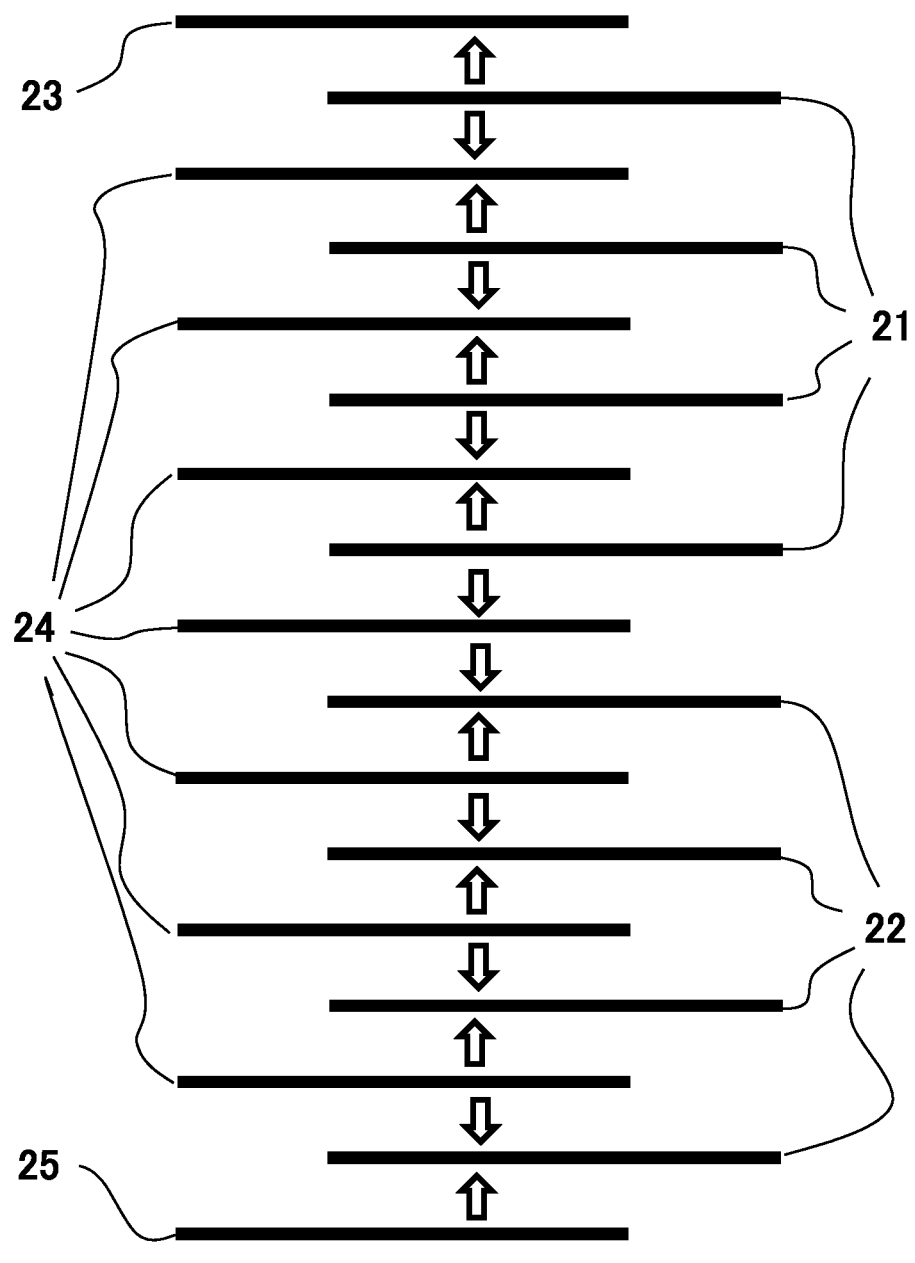
FIG. 7 is a view for explaining the structure of the vibration element shown in FIG. 5.

FIG. 5 is a perspective view schematically showing the vibration element 14. FIGS. 6(a) through 6(e) are plan views schematically showing the configurations of electrodes 21 to 25 provided in the vibration element 14. FIG. 7 is a view schematically showing the positional relationship among the electrodes 21 to 25 in the first direction (the z-axis direction in the drawing) and the states of polarization of piezoelectric layers 27 interposed among the electrodes 21 to 25. In FIGS. 6(a) to 6(d), there is shown the state as viewed from one side in the first direction (+z-direction side in the drawing), whereas, in FIG. 6(e), there is shown the state as viewed from the other side in the first direction (−z-direction side in the drawing). Moreover, in FIG. 7, the diagrammatic representation of a staked body 20, first to third terminal electrodes, and the piezoelectric layers 27 is omitted.

The vibration element 14 comprises the stacked body 20, the first terminal electrode 41, the second terminal electrode 42, and the third terminal electrode (not shown). At the end face of one side of the stacked body 20 in the second direction (+x-direction side in the drawing), the first and second terminal electrodes 41 and 42 are disposed straddling both end faces thereof in the first direction (the z-axis direction in the drawing). Moreover, on the end face of the other side of the stacked body 20 in the second direction (−x-direction side in the drawing), the third terminal electrode (not shown) is disposed.

The stacked body 20 is constructed by alternately arranging a plurality of piezoelectric layers 27 polarized in the first direction (the z-axis direction in the drawing) and a plurality of flat electrodes 21 to 25 along the first direction. The electrode 23 is disposed on one surface of the stacked body 20 in the first direction (+z-direction side in the drawing). The electrode 25 is disposed on the other surface of the stacked body 20 in the first direction (−z-direction side in the drawing). A plurality of electrodes 21, electrodes 22, and electrodes 24 are arranged within the stacked body 20. The electrodes 21 or the electrodes 22, and the electrodes 23 or the electrodes 24 or the electrodes 25, are alternately arranged in the first direction (the z-axis direction in the drawing). Moreover, on one side in the first direction (+z-direction side in the drawing), the electrodes 23 or the electrodes 24, and the electrodes 21 are alternately arranged, whereas, on the other side in the first direction (−z-direction side in the drawing), the electrodes 24 or the electrodes 25, and the electrodes 22 are alternately arranged.

The electrode 21 has such a configuration that one end of a rectangular extension portion 21b is connected to one end of a rectangular main-body portion 21a disposed at intervals with respect to the side surfaces of the stacked body 20. The other end of the extension portion 21b is connected to the first terminal electrode 41. The electrode 22 has such a configuration that one end of a rectangular extension portion 22b is connected to one end of a rectangular main-body portion 22a disposed at intervals with respect to the side surfaces of the stacked body 20. The other end of the extension portion 22b is connected to the second terminal electrode 42. The electrodes 23, 24, and 25 are each given a rectangular shape, only one end of which in the lengthwise direction is exposed at the side surface of the stacked body 20. The lengthwise one end of each of the electrodes 23, 24, and 25 is connected to the third terminal electrode (not shown).

Moreover, the piezoelectric layers 27 interposed among the electrodes 21 to 25 are polarized in the directions indicated by arrows as shown in FIG. 7. That is, one side in the first direction (+z-direction side in the drawing) is polarized in a direction of from the electrode 21 to the electrode 23, 24, whereas, the other side in the first direction (−z-direction side in the drawing) is polarized in a direction of from the electrode 24, 25 to the electrode 22. At the time of imparting vibration to the vibration element 14, for example, alternating current voltage is applied in a manner such that the electrodes 21 and 22 stand at the same potential, that the electrodes 23, 24, and 25 stand at the same potential, and that a potential difference is caused between the electrode 21, 22 and the electrode 23, 24, 25. Thus, the vibration element 14 is so designed that there is an opposite relationship between one side and the other side thereof in the first direction (the z-axis direction in the drawing) in polarization with respect to the direction of an electric field applied at a certain moment.

Accordingly, following the application of an electric signal, when one side in the first direction (+z-direction side in the drawing) is caused to stretch in the second direction (the x-axis direction in the drawing), then the other side in the first direction (−z-direction side in the drawing) is caused to shrink in the second direction. In this way, upon the inputting of an electric signal, the vibration element 14 vibrates in bending mode in the first direction in a manner such that the amplitude varies along the second direction perpendicular to the first direction. In fact, the vibration element 14 is a piezoelectric vibration element constructed of a piezoelectric body having a bimorph structure (piezoelectric bimorph element).

In the vibration element 14, the stacked body 20 may have a length in a range of about 18 mm to 28 mm, a width in a range of about 1 mm to 6 mm, and a thickness in a range of about 0.2 mm to 1.0 mm, for example. Moreover, the electrodes 21 to 25 may have a length in a range of about 17 mm to 25 mm and a width in a range of about 0.5 mm to 1.5 mm, for example.

The piezoelectric layers 27 constituting the stacked body 20 can be suitably made of lead titanate (PT), lead zirconate titanate (PZT), or a non-lead piezoelectric material such as a Bi-layer compound or a compound with tungsten bronze-type structure, but other piezoelectric materials can also be used. The thickness of a single piezoelectric layer 27 can be adjusted to fall in a range of about 0.01 mm to 0.1 mm, for example. The electrode 21, 22, 24 can be made suitably of, for example, a metal component such as silver or a silver-palladium alloy that contains a ceramic component or glass component, but other heretofore known metal materials can also be used. The electrode 23, 25 and the first to third terminal electrodes should preferably contain a metal component made of silver and a glass component, but a metal other than silver can also be adopted for use.

For example, such a vibration element 14 can be produced by the following method. To begin with, a binder, a dispersant, a plasticizer, and a solvent are admixed in a powdery piezoelectric material, and the admixture is stirred to form a slurry, whereafter the resultant slurry is molded into sheet form, thereby forming green sheets. Then, a conductor paste is printed on the green sheets to form electrode patterns for the electrodes 21, 22, and 24, and the green sheets bearing the electrode patterns are stacked on top of each other, and are pressed using a pressing apparatus to form a stacked molded product. After that, the stacked molded product is subjected to degreasing treatment and firing process, and is then cut into a predetermined dimension, whereupon a stacked body can be obtained. Next, after the printing of a conductor paste for the formation of the electrodes 23 and 25, the first terminal electrode 41, the second terminal electrode 42, and the third terminal electrode (not shown) with subsequent baking process at a predetermined temperature, a direct-current voltage is applied to the stacked body through the first to third terminal electrodes to effect polarization of the piezoelectric layers 27. In this way, the vibration element 14 can be obtained. Moreover, the connection between the vibration element 14 and the vibration plate 12 can be made by using, for example, already available adhesives of various types.

In a case where the electrode disposed in an exposed state at the end face of the stacked body 20 in the first direction (the z-axis direction in the drawing) becomes a problem, a protective layer made of a piezoelectric material or the like may be provided. In this case, it is desirable to render the protective layer sufficiently small in thickness.

The vibration device 15 of this embodiment thusly constructed serves as a vibration device for imparting vibration to the vibration plate 12 by causing the vibration element 14 to vibrate in bending mode through the application of an electric signal. Moreover, in the vibration device 15 of this embodiment, the surface of one side of the vibration element 14 in the first direction (+z-direction side in the drawing) is connected to one main surface (main surface on −z-direction side in the drawing) of the second portion 12b in the vibration plate 12. Accordingly, the vibration device 15 of this embodiment can be made lower in profile. Further, in the vibration device 15 of this embodiment, since the vibration element 14 is elongated in the second direction (the x-axis direction in the drawing), it is possible to achieve efficient generation of bending vibration in the second direction in the vibration plate 12.

Moreover, in the vibration device 15 of this embodiment, given that the distance between the vibration element 14 and the first portion 12a in the third direction (the y-axis direction in the drawing) is a first distance d1, and the distance between the vibration element 14 and the first portion 12a in the second direction (the x-axis direction in the drawing) is a second distance d2, then the first distance d1 is longer than the second distance d2. This allows the vibration device 15 of this embodiment to impart great vibration to the vibration plate 12. Moreover, in the vibration device 15 of this embodiment, a relationship given as: $d1/d2 \geq 1.5$ holds between the first distance d1 and the second distance d2. This allows the vibration device 15 of this embodiment to impart even greater vibration to the vibration plate 12.

In a case where the distance on one side of the vibration element 14 in the third direction between the vibration element 14 and the first portion 12a in the third direction (the y-axis direction in the drawing) differs from the distance on the other side of the vibration element 14 in the third direction between the vibration element 14 and the first portion 12a in the third direction, a smaller one of the distances is defined as the first distance d1. Likewise, where the distance on one side of the vibration element 14 in the second direction between the vibration element 14 and the first portion 12a in the second direction (the x-axis direction in the drawing) differs from the distance on the other side of the vibration element 14 in the second direction between the vibration element 14 and the first portion 12a in the second direction, a smaller one of the distances is defined as the second distance d2. That is, the first distance d1 is equivalent to the minimum value of the distance between the vibration element 14 and the first portion 12a in the third direction, and the second distance d2 is equivalent to the minimum value of the distance between the vibration element 14 and the first portion 12a in the second direction.

The inventors investigated variations in the intensity of vibration of the vibration plate 12 by making changes to the position of installation of the vibration element 14, and, according to the result, when the vibration element 14 was placed too close to the first portion 12a, the vibration of the vibration plate 12 has been weakened extremely. Moreover, it has been found out that the first distance d1 is of particular importance in imparting great vibration to the vibration plate 12, and it is necessary that the first distance d1 should be longer than at least the second distance d2 to impart great vibration to the vibration plate 12. It has also been found out that, by setting the first distance d1 to be 1.5 times or more as much as the second distance d2, it is possible to vibrate the vibration plate 12 vigorously to the same extent as the case of locating the vibration element 14 centrally of the second portion 12b in the third direction (the y-axis direction in the drawing). Note that the vibration of the vibration plate 12 will be weakened also in a case where the second distance d2 is too short, and thus the second distance d2 should preferably be set to be 0.3 times or more as much as the length of the vibration element 14 in the second direction (the x-axis direction in the drawing).

Moreover, in the vibration device 15 of this embodiment, since the vibration element 14 the vibration plate 12 are so arranged that their lengthwise directions are perpendicular to each other, it is possible to dispose the vibration element 14 around the edge of the vibration plate 12 while preventing the weakening of vibration of the vibration plate 12, as well as to suppress occurrence of a rapid rise in vibration of the vibration plate 12 at a specified frequency.

Second Embodiment

Figure 10:
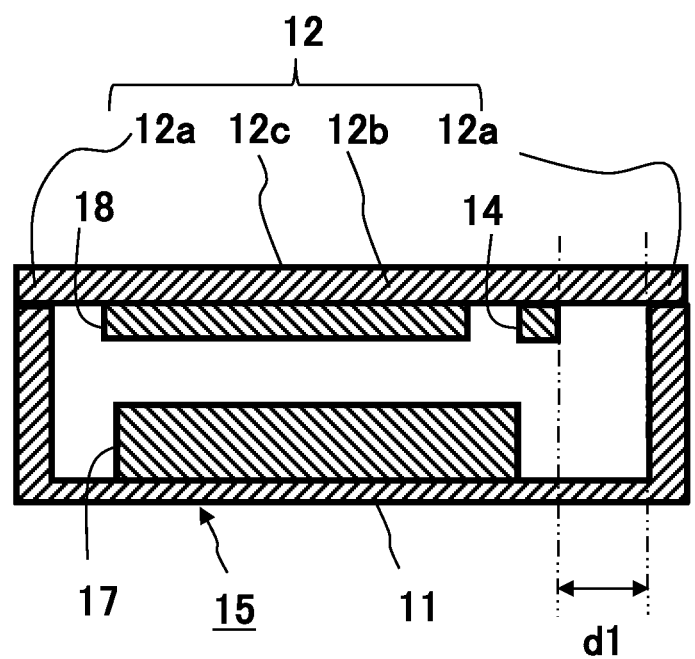
FIG. 10 is a sectional view taken along the line D-D' of FIG. 8.

FIG. 8 is a perspective view schematically showing a portable terminal in accordance with a second embodiment of the invention. FIG. 9 is a sectional view taken along the line C-C' of FIG. 8. FIG. 10 is a sectional view taken along the line D-D' of FIG. 8. In FIGS. 9 and 10, the diagrammatic representation of the detailed structure of the vibration element 14 is omitted. Moreover, the following description of this embodiment will deal only with points of difference from the first embodiment described above, and like constituent components will be identified with the same reference symbols and overlapping descriptions will be omitted. The portable terminal of this embodiment comprises: the vibration device 15 of the first embodiment described above; an electronic circuit 17; and a display 18.

The electronic circuit 17 generates an electric signal to be inputted to the vibration element 14. The electric signal bears sound information. Moreover, the electronic circuit 17 may include another circuit such as a circuit for processing image information shown on the display 18 and a communication circuit. The electronic circuit 17 and the vibration element 14 are connected to each other via non-illustrated wiring.

The display 18 is a display device having the function of showing image information, and a heretofore known display, such for example as a liquid crystal display, a plasma display, and an organic EL display, is suitable for use as the display 18. Moreover, the display 18 may be configured to include an input device such as a touch panel.

In the portable terminal of this embodiment, the vibration plate 12 is located outward beyond the display 18, is connected to the display 18 in unitary relation thereto, and serves as a cover for protection of the display 18. Moreover, the vibration plate 12 may be configured to include an input device such as a touch panel.

The portable terminal of this embodiment thusly constructed is capable of sound production through the vibration of the vibration plate 12 caused by vibrating the vibration element 14. The produced sound allows transmission of sound information to humans. Moreover, sound information may also be transmitted by bringing the vibration plate 12 or the support body 11 into contact with part of the human body such as ear directly or through other object for conveyance of vibration.

Since the portable terminal of this embodiment effects transmission of sound information by utilizing the low-profile vibration device 15 capable of production of great vibration, it is possible to obtain a low-profile portable terminal capable of carrying sound information with clarity.

The portable terminal of this embodiment is preferably so designed that the difference in amplitude between individual places within a first surface 12c of the vibration plate 12 in a vibrating state is less than or equal to 60 dB in terms of a ratio of maximum value to minimum value of amplitude. That is, the vibration plate 12 has been vibrated by the application of an electric signal bearing sound information to the vibration element 14 for a comparison between the amplitude of the first surface 12c of the vibration plate 12 and the audibility obtained when the ear approached the first surface 12c of the vibration plate 12, and the result of the comparison showed that the ratio of the amplitude with which the sound is so loud that discomfort may be caused to the minimum amplitude with which the sound information is acquirable (conversation is audible) stood at 60 dB. Note that 60 dB is a value equivalent to the difference between 40 dB which is an audible level where quiet conversation can be heard and 100 dB which is an audible level where a shout in the human ear can be heard. Moreover, there is a proportional relationship between the amplitude of the first surface 12c of the vibration plate 12 and a sound pressure in a space close to the first surface 12c of the vibration plate 12.

By making adjustment in a manner such that the difference in amplitude between individual places within the first surface 12c of the vibrating vibration plate 12 is less than or equal to 60 dB in terms of the ratio of maximum value to minimum value of amplitude, it is possible to acquire sound information regardless of which part of the first surface 12c of the vibration plate 12 approaches the ear. Hence, according to the portable terminal of this embodiment, it is possible to obtain a portable terminal capable of acquiring sound information successfully simply by being brought near to or into contact with the ear without the necessity of giving care in handling.

It is more preferable that the difference in amplitude between individual places within the first surface 12c of the vibrating vibration plate 12 is less than or equal to 20 dB in terms of the ratio of maximum value to minimum value of amplitude. That is, the vibration plate 12 has been vibrated by the application of an electric signal bearing sound information to the vibration element 14 for a comparison between the amplitude of the first surface 12c of the vibration plate 12 and the audibility obtained when the ear approached the first surface 12c of the vibration plate 12, and the result of the comparison showed that, by making adjustment in a manner such that the difference in amplitude between individual places within the first surface 12c of the vibrating vibration plate 12 is less than or equal to 20 dB in terms of the ratio of maximum value to minimum value of amplitude, conversations ranging from a quiet conversation to a loud conversation could be heard successfully regardless of which part of the first surface 12c of the vibration plate 12 approached the ear. Note that an audible level where a quiet conversation can be heard stands at 40 dB, whereas an audible level where a loud conversation can be heard stands at 80 dB. That is, there is a level difference of 40 dB between quiet voice and loud voice in conversation. The ratio of the amplitude with which the sound is so loud that discomfort may be caused to the minimum amplitude with which sound information is acquirable (conversation is audible), namely 60 dB, minus the level difference between quiet voice and loud voice in conversation, namely 40 dB, is 20 dB. It will thus be seen that, by making adjustment in a manner such that the difference in amplitude between individual places within the first surface 12c of the vibrating vibration plate 12 is less than or equal to 20 dB in terms of the ratio of maximum value to minimum value of amplitude, conversations ranging from a quiet conversation to a loud conversation can be heard successfully regardless of which part of the first surface 12c of the vibration plate 12 approaches the ear.

In order to reduce the difference in amplitude between individual places within the first surface 12c of the vibration plate 12, it is advisable to connect the periphery of the vibration plate 12 to the support body 11 firmly. In so doing, although the amplitude of the vibration plate 12 decreases, the difference in amplitude between individual places within the first surface 12c can be reduced. In order to connect the vibration plate 12 to the support body 11 firmly, for example, it is advisable to increase the coefficient of elasticity of a member (such as an adhesive) for connecting the vibration plate 12 with the support body 11, or to increase the area of the first portion 12a of the vibration plate 12 connected to the cabinet 11.

Moreover, the portable terminal of this embodiment is preferably so designed that, in a point A which is a given place within the first surface 12c of the vibrating vibration plate 12, the difference in amplitude between a case where a load of 10 N is applied to the point A and a case where no load of 10 N is applied thereto is less than or equal to 60 dB in terms of the ratio of the amplitude corresponding to the noload case to the amplitude corresponding to the 10 N-loaded case. That is, as the result of measurement of loads applied to the portable terminal when it is brought into contact with the ear for phone conversation, it has been found out that the load was about 10 N in the case of pressing the portable terminal against the ear with some strength. Accordingly, by making adjustment in a manner such that, in the point A which is a given place within the first surface 12c of the vibrating vibration plate 12, the difference in amplitude between the case of applying a load of 10 N to the point A and the case of applying no load is less than or equal to 60 dB in terms of the ratio of the amplitude corresponding to the noload case to the amplitude corresponding to the 10 N-loaded case, it is possible to obtain a portable terminal capable of acquiring sound information successfully simply by being brought near to or into contact with the ear without the necessity of giving care in handling. That is, it is possible to obtain a portable terminal capable of acquiring sound information successfully by any of the following instances: making an approach to the ear; making contact with the ear lightly; and making contact with the ear with some strength.

Moreover, by making adjustment in a manner such that, in the point A which is a given place within the first surface 12c of the vibrating vibration plate 12, the difference in amplitude between the case of applying a load of 10 N to the point A and the case of applying no load is less than or equal to 20 dB in terms of the ratio of the amplitude corresponding to the noload case to the amplitude corresponding to the 10 N-loaded case, conversations ranging from a quiet conversation to a loud conversation can be heard successfully simply by bringing the portable terminal near to or into contact with the ear without the necessity of giving care in handling. That is, it is possible to obtain a portable terminal by which conversations ranging from a quiet conversation to a loud conversation can be heard successfully by any of the following instances: making an approach to the ear; making contact with the ear lightly; and making contact with the ear with some strength.

In order to reduce the difference in amplitude between the case where a load is applied to the first surface 12c of the vibrating vibration plate 12 and the case where no load is applied thereto, as has already been described, it is advisable to decrease the coefficient of elasticity of the member for connecting the vibration plate 12 with the vibration element 14. Moreover, since firm connection of the vibration plate 12 to the support body 11 is also conducive to the reduction of amplitude difference, it is effective to increase the coefficient of elasticity of the member for connecting the vibration plate 12 with the support body 11, as well as to increase the area of connection between the vibration plate 12 and the support body 11.

Moreover, the portable terminal of this embodiment is preferably so designed that, in a given location within the first surface 12c of the vibrating vibration plate 12, under a condition where the given location is subjected to a load of 10 N, the difference in amplitude between individual places within the first surface 12c is less than or equal to 60 dB in terms of the ratio of maximum value to minimum value of amplitude. That is, it is preferable that, in a given location within the first surface 12c of the vibrating vibration plate 12, when the amplitude of the given location in a 10 N-loaded case is measured, then the difference in amplitude between individual places within the first surface 12c is less than or equal to 60 dB in terms of the ratio of maximum value to minimum value of amplitude. In this case, sound information can be acquired regardless of which part of the first surface 12c of the vibration plate 12 is pressed against the ear. Accordingly, it is possible to obtain a portable terminal capable of acquiring sound information successfully simply by being brought into contact with the ear without the necessity of giving care in handling.

Further, it is more preferable that, in a given location within the first surface 12c of the vibrating vibration plate 12, under a condition where the given location is subjected to a load of 10 N, the difference in amplitude between individual places within the first surface 12c is less than or equal to 20 dB in terms of the ratio of maximum value to minimum value of amplitude. In this case, conversations ranging from a quiet conversation to a loud conversation can be heard successfully regardless of which part of the first surface 12c of the vibration plate 12 is pressed against the ear.

It is noted that, in the implementation of a portable terminal capable of successful acquisition of sound information with ease, amplitude variation in a microlevel region of the vibration plate 12 that exerts no influence on the acquisition of sound information is immaterial. What matters is amplitude variation on a macro level in the first surface 12c of the vibration plate 12 that exerts influence on the acquisition of sound information. Accordingly, in amplitude measurement, preferably, an acceleration sensor having a predetermined dimension is stuck to the first surface 12c of the vibration plate 12, and amplitude is determined by calculation on the basis of a rate of acceleration detected by the acceleration sensor. Moreover, although it is said that the range of frequency of human conversation is about from 500 Hz to 2 kHz, since the amplitude on a macro level within the first surface 12c of the vibration plate 12 varies little with frequency, it is advisable to measure an amplitude obtained when an electric signal of 1 kHz is inputted to the vibration element 14.

MODIFIED EXAMPLE

It should be understood that the application of the invention is not limited to the embodiments described heretofore, and that various changes and modifications are possible without departing from the scope of the invention.

For example, although the first embodiment described above has been described with respect to the case where the vibration element 14 is located centrally of the second portion 12b in the second direction (the x-axis direction in the drawing), this does not constitute any limitation. The vibration element 14 may be located toward one side of the second portion 12b in the second direction.

Moreover, although the first embodiment described above has been described with respect to the case where the vibration element 14 includes the piezoelectric layers 27 laminated in 16 layers, this does not constitute any limitation. The number of the piezoelectric layers 27 may be either greater than 16 or smaller than 16.

Further, although the second embodiment described above has been described with respect to the case where the vibration device 15 of the first embodiment is provided, this does not constitute any limitation, and thus a vibration device of another form may be provided instead.

In addition, although the second embodiment described above has been described with respect to the case where the cover of the display 18 serves as the vibration plate 12, this does not constitute any limitation. For example, the display 18 per se may serve as the vibration plate 12.

EXAMPLES

First Example

Next, concrete examples of the vibration device of the invention will be described. A vibration device according to the first described embodiment of the invention and a vibration device according to a comparative example were fabricated, for determination of characteristics.

In fabricating the vibration device, an aluminum-made frame-like body was used as the support body 11. As the vibration plate 12, a glass plate which was 96 mm in length, 49 mm in width, and 0.7 mm in thickness was used, and the periphery of one main surface on the other side of the vibration plate in the first direction (−z-direction side in the drawing) was fixedly connected to the support body 11 in a width of 4 mm. That is, the 4 mm-wide peripheral part of the vibration plate 12 acts as the first portion 12a, and the other inwardly-located part thereof which is 88 mm in length and 41 mm in width acts as the second portion 12b. A 0.2 mm-thick double-faced tape was used for the bonding of the vibration plate 12 and the support body 11.

The vibration element 14 was given a rectangular parallelepiped shape which was 23.5 mm in length, 3.3 mm in width, and 0.5 mm in thickness. Moreover, the vibration element 14 was constructed by alternately laminating ca. 30 μm-thick piezoelectric layers 27 and internal electrodes 21 to 25 one after another, and the total number of the piezoelectric layers 27 was 16. The piezoelectric layer 27 was made of lead zirconate titanate (PZT) in which Zr was replaced in part with Sb. A 0.2 mm-thick double-faced tape formed of a nonwoven fabric-made base material with an acrylic adhesive coating on both sides was used for the bonding of the vibration plate 12 and the vibration element 14. Then, the entire surface of one side of the vibration element 14 in the first direction (+z-direction side in the drawing) was stuck to the vibration plate 12. Moreover, the vibration element 14 was located centrally of the second portion 12b in the second direction (the x-axis direction in the drawing).

Then, the position of the vibration element 14 in the second direction (the x-axis direction in the drawing) has been changed to obtain various values of d1/d2 which is the ratio of the first distance d1 to the second distance d2, so that three vibration devices 15 of the first embodiment of the invention having a d1/d2 value of 1.5, a d1/d2 value of 2.6, and a d1/d2 value of 4.8, respectively, were fabricated, and two vibration devices of comparative example having a d1/d2 value of 0.4 and a d1/d2 value of 1.0, respectively, were also fabricated. Note that, in the vibration device 15 having the d1/d2 value of 4.8, the vibration element 14 was located centrally of the second portion 12b in the third direction (the y-axis direction in the drawing).

The sound pressure of the sound produced from the vibration plate 12 of the fabricated vibration device was measured. In the measurement, a microphone was set at a position spaced 10 mm away from the surface of one side of the vibration plate 12 in the first direction (+z-direction side in the drawing), and a sound pressure detected by the microphone under a condition where a sinusoidal signal of a voltage of 30 Vp-p was inputted to the vibration element 14 was measured. Note that the frequency of a sinusoidal signal inputted to the vibration element 14 has been varied in three levels: 1 kHz; 1.5 kHz; and 2 kHz, and the measurement was conducted at each of the frequency levels.

Figure 11:
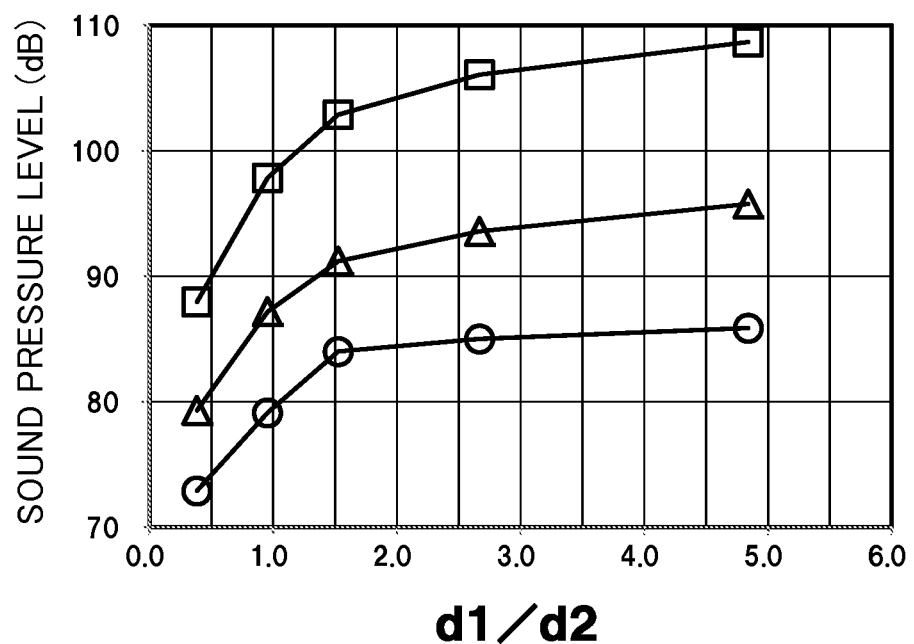
FIG. 11 is a graph showing a sound pressure of sound generated from the vibration devices of the first embodiment of the invention and a comparative example.

The result of the measurement is shown in the graph of FIG. 11. In the graph of FIG. 11, the abscissa axis represents d1/d2 which is the ratio of the first distance d1 to the second distance d2, and the ordinate axis represents sound pressure. Moreover, the result of measurement corresponding to the case where the frequency of a sinusoidal signal inputted to the vibration element 14 was 1 kHz is indicated by a hollow circle; the result of measurement corresponding to the case where the frequency thereof was 1.5 kHz is indicated by a hollow triangle; and the result of measurement corresponding to the case where the frequency thereof was 2 kHz is indicated by a hollow square. It will be understood from the graph shown in FIG. 11 that, by setting the value d1 to be larger than the value d2, it is possible to impart great vibration to the vibration plate 12 and thereby produce sound with a sufficient sound pressure. It will also be understood that, so long as the relationship of d1/d2≥1.5 holds, it is possible to produce sound with a sound pressure of substantially the same level as obtained when the vibration element 14 is located centrally of the vibration plate 12 in the third direction (the y-axis direction in the drawing). Thus, availability of the invention could be confirmed.

Second Example

Next, a concrete example of the portable terminal of the invention will be described. The portable terminal of the second embodiment of the invention as shown in FIGS. 8 to 10 was fabricated for evaluation.

The first step was to produce the portable terminal of the second embodiment of the invention as shown in FIGS. 8 to 10. The vibration plate 12 was made of a glass plate which was 95 mm in length, 48 mm in width, and 0.7 mm in thickness. The vibration element 14 was given a rectangular parallelepiped shape which was 25.0 mm in length, 4.0 mm in width, and 0.75 mm in thickness. Moreover, the vibration element 14 was constructed by alternately laminating ca. 30 μm-thick piezoelectric layers and electrode layers one after another, and the total number of the piezoelectric layers was 24. The piezoelectric layer was made of lead zirconate titanate (PZT) in which Zr was replaced in part with Sb. A 0.16 mm-thick double-faced tape formed of a nonwoven fabric-made base material with an acrylic adhesive coating on both sides was used for the bonding of the vibration plate 12 and the vibration element 14, and the tape was stuck to the entire surface of the +z-direction side of the vibration element 14. A 0.15 mm-thick double-faced tape formed of a nonwoven fabric-made base material with an acrylic adhesive coating on both sides was used for the bonding of the vibration plate 12 and the support body 11, and the periphery of the surface of the vibration plate 12 opposite from the first surface 12c was entirely connected to the support body 11. As the support body 11, a synthetic resin-made body was used.

An electric signal was inputted to the vibration element 14 to measure the amplitudes of individual places within the first surface 12c of the vibration plate 12. In amplitude measurement, to begin with, an acceleration sensor was set at a measurement point within the first surface 12c, and amplitude calculation has been made on the basis of the measured value of the acceleration rate at that point. Subsequently, amplitude measurement has been performed likewise under a condition where the acceleration sensor is pressed from above to apply a load of 10 N. These steps have been performed for each of places within the first surface 12c of the vibration plate 12 with varying measurement points.

An electric signal to be inputted to the vibration element 14 has been generated by amplifying, with a power amplifier (POP 120-2.5 manufactured by Matsusada Precision Inc.), a signal generated by a synthesized function generator (FG 110 manufactured by Yokogawa Meters & Instruments Corporation) under a condition of a sine wave of 30 Vpp at 1 kHz.

As the acceleration sensor, SV1109 manufactured by NEC Avio Infrared Technologies Co., Ltd. was used, and, the 8 mm-diameter circular surface of the acceleration sensor was stuck to a predetermined position of the first surface 12c of the vibration plate 12 by an adhesive. Then, a charge signal outputted from the acceleration sensor was converted into a voltage signal by a charge amplifier (AG2101 manufactured by NEC Avio Infrared Technologies Co., Ltd.), and the reading of voltage was effected by a digital oscilloscope (DL1540 manufactured by Yokogawa Electric Corporation) to derive a rate of acceleration by using a formula for conversion between voltage and acceleration included with the charge amplifier. An amplitude $\beta$ was determined by using a formula expressed as: $\beta=2\alpha/\omega^2$, wherein $\omega$ represents angular frequency of the electric signal inputted to the vibration element 14; $\alpha$ represents acceleration rate; and $\beta$ represents amplitude.

A load cell (C2G1-6K-A manufactured by Minebea Co., Ltd.) was used for measurement of a load applied from above the acceleration sensor, and, the value of a load indicated on a digital peak holder (CSD-819C manufactured by Minebea Co., Ltd.) connected to the load cell was read out. The load cell was put under the portable terminal.

That is, on a holder disposed on the load cell was set the portable terminal, with the first surface 12c of the vibration plate 12 facing upward, and, the acceleration sensor was stuck to a measurement point on the first surface 12c of the vibration plate 12. Subsequently, at first, an electric signal was inputted to the acceleration sensor in this state to measure an amplitude in a noload case. Next, a load of 10 N was applied from above the acceleration sensor, and an electric signal was inputted to the acceleration sensor in this state to measure an amplitude in a loaded case.

As the result of the measurement, according to a comparison made in the noload case, in the first surface 12c, the amplitude of a smallest-amplitude place was 0.58 μm, and the amplitude of a largest-amplitude place was 2.98 μm. The ratio of the maximum amplitude: 2.98 μm to the minimum amplitude: 0.58 μm stood at 14.2 dB. Note that the largest-amplitude place of the first surface 12c corresponds to the location where the vibration element 14 is attached to the opposite surface, and the smallest-amplitude place of the first surface 12c corresponds to the end of the side of the vibration plate 12 opposite from the side fitted with the vibration element 14 in the direction of length of the vibration plate 12. Even when changes were made to the frequency of the electric signal inputted to the vibration element 14, the same result was obtained.

Moreover, in the first surface 12c, greatest amplitude variation between the noload case and the 10 N-loaded case occurred at the location where the vibration element 14 was attached to the opposite surface, and, the amplitude in the 10 N-loaded case was 0.57 μm. The ratio of the amplitude in the noload case to the amplitude in the 10 N-loaded case stood at 14.3 dB.

Further, as to the amplitude of the location subjected to a load of 10 N, the amplitude of a smallest-amplitude place within the first surface 12c was 0.15 μm, and the amplitude of a largest-amplitude place within the first surface 12c was 0.57 μm. The ratio of the maximum amplitude: 0.57 μm to the minimum amplitude: 0.15 μm stood at 11.6 dB.

Next, with the inputting of a normal sound signal to the vibration element 14, audibility evaluation has been conducted by bringing the first surface 12c of the vibration plate 12 near to or into contact with the ear. The result showed that voices ranging from a quiet voice to a loud voice could be heard successfully simply by bringing the first surface 12c near to or into contact with the ear without the necessity of giving care in handling, with consequent successful acquisition of sound information. Whether the first surface 12c is kept out of contact with the ear or the first surface 12c is pressed against the ear, the same effect could be obtained. Moreover, the same effect could be obtained regardless of which part of the first surface 12c is pressed against the ear. Further, the contact of the first surface 12c with the ear allowed successful acquisition of sound information even in a noisy environment.

REFERENCE SIGNS LIST

11: Support body
12: Vibration plate
12a: First portion
12b: Second portion
12c: First surface
14: Vibration element
15: Vibration device
17: Electronic circuit
21, 22, 23, 24, 25: Electrode
27: Piezoelectric layer
d1: First distance
d2: Second distance

What is claimed is:

1. A vibration device, comprising at least:
a support body;
a vibration member supported so that its periphery is connected to the support body, the vibration member having a first portion which is connected to the support body, and a second portion which is located inside the first portion and is not connected to the support body; and
a vibration element whose one surface in a first direction is connected to one main surface of the second portion in the vibration member, bending vibration of the vibration element in the first direction whose amplitudes vary along a second direction perpendicular to the first direction being caused by electrical signal input, wherein
the vibration element is elongated in the second direction,
the vibration member has a rectangular shape elongated in a third direction which is perpendicular to the first and second directions, and
a relationship of d1/d2≥1.5 is maintained, wherein d1 denotes a distance between the vibration element and the first portion in the third direction and d2 denotes a distance between the vibration element and the first portion in the second direction.

2. The vibration device according to claim 1,
wherein the vibration member has its first surface exposed to an exterior, which is the other main surface of the vibration member, and is vibrated when the vibration element vibrates in response to the electric signal, and wherein, in a point A which is a given place within the first surface of the vibration member in a vibrating state, when an amplitude corresponding to a case where a load of 10 N is applied to the point A and an amplitude corresponding to a case where no load is applied thereto are measured, a ratio of the amplitude corresponding to the no load case to the amplitude corresponding to the 10 N-loaded case is less than or equal to 60 dB.

3. The vibration device according to claim 2, wherein, in a given location within the first surface of the vibrating vibration member, under a condition where the given location is subjected to a load of 10 N, a difference in amplitude between individual places within the first surface is less than or equal to 60 dB in terms of a ratio of maximum value to minimum value of amplitude.

4. A portable terminal comprising at least;

the vibration device according to claim 1; and an electronic circuit that generates an electric signal to be inputted to the vibration element.

* * * * *